(12) United States Patent
Sugiura et al.

(10) Patent No.: US 11,212,906 B2
(45) Date of Patent: Dec. 28, 2021

(54) LAMINATED SUBSTRATE

(71) Applicant: Murata Manufacturing Co., Ltd., Nagaokakyo (JP)

(72) Inventors: Kosuke Sugiura, Nagaokakyo (JP); Issei Yamamoto, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 16/895,444

(22) Filed: Jun. 8, 2020

(65) Prior Publication Data

US 2020/0305272 A1    Sep. 24, 2020

Related U.S. Application Data

(63) Continuation of application No. PCT/JP2018/037853, filed on Oct. 11, 2018.

(30) Foreign Application Priority Data

Mar. 1, 2018   (JP) .............................. JP2018-036577

(51) Int. Cl.
*H05K 1/02* (2006.01)
*H05K 1/03* (2006.01)
(Continued)

(52) U.S. Cl.
CPC ......... *H05K 1/0206* (2013.01); *H05K 1/0306* (2013.01); *H05K 1/09* (2013.01);
(Continued)

(58) Field of Classification Search
CPC ...... H05K 1/0206; H05K 1/0306; H05K 1/09; H05K 3/4061; H05K 3/4644; H05K 1/181;
(Continued)

(56) References Cited

U.S. PATENT DOCUMENTS 5,216,207 A * 6/1993 Prabhu .................. C03C 14/004
106/1.13
7,269,017 B2 * 9/2007 Berlin ................. H01L 23/3677
361/719
(Continued)

FOREIGN PATENT DOCUMENTS

JP     H05251834 A    9/1993
JP     H08157264 A    6/1996
(Continued)

OTHER PUBLICATIONS

International Search Report issued for PCT/JP2018/037853, dated Dec. 25, 2018.
(Continued)

*Primary Examiner* — Ishwarbhai B Patel
(74) *Attorney, Agent, or Firm* — Arent Fox LLP

(57) ABSTRACT

A laminated substrate that includes a substrate body having a plurality of laminated ceramic layers containing a first glass; a wiring conductor within the substrate body and made from silver, copper, a silver alloy, or a copper alloy; and a thermal conductor within or on a main surface of the substrate body. The thermal conductor is at least one of (1) a thermal via penetrating a part of a first ceramic layer of the plurality of laminated ceramic layers in a thickness direction thereof, and (2) a heat spreader extending along a main surface of the first ceramic layer of the plurality of laminated ceramic layers. A first thermal conductivity of the thermal conductor is higher than a second thermal conductivity of the first ceramic layer, and the thermal conductor contains an insulating ceramic as a main material thereof, and further contains a second glass.

20 Claims, 3 Drawing Sheets

(51) Int. Cl.
*H05K 1/09* (2006.01)
*H05K 1/11* (2006.01)
*H05K 1/18* (2006.01)
*H05K 3/40* (2006.01)
*H05K 3/46* (2006.01)

(52) U.S. Cl.
CPC ......... *H05K 3/4061* (2013.01); *H05K 3/4644* (2013.01); *H05K 1/0207* (2013.01); *H05K 1/0271* (2013.01); *H05K 1/111* (2013.01); *H05K 1/181* (2013.01); *H05K 2201/066* (2013.01); *H05K 2201/068* (2013.01); *H05K 2201/10522* (2013.01); *H05K 2201/10734* (2013.01)

(58) Field of Classification Search
CPC ... H05K 2201/066; H05K 2201/10522; H05K 2201/10734; H05K 1/0271; H05K 2201/068
See application file for complete search history.

(56) References Cited

U.S. PATENT DOCUMENTS

| | | | | |
|---|---|---|---|---|
| 2005/0236180 | A1* | 10/2005 | Sarma | H05K 3/4629 |
| | | | | 174/256 |
| 2007/0108586 | A1* | 5/2007 | Uematsu | H05K 3/281 |
| | | | | 257/690 |
| 2014/0206522 | A1 | 7/2014 | Yano et al. | |
| 2015/0181711 | A1* | 6/2015 | Nakabayashi | H01L 33/62 |
| | | | | 257/99 |

FOREIGN PATENT DOCUMENTS

| | | |
|---|---|---|
| JP | 2002329939 A | 11/2002 |
| JP | 2003046238 A | 2/2003 |
| JP | 2008270741 A | 11/2008 |
| JP | 2011077113 A | 4/2011 |
| WO | 2013008920 A1 | 1/2013 |
| WO | 2014038230 A1 | 3/2014 |

OTHER PUBLICATIONS

Written Opinion of the International Searching Authority issued for PCT/JP2018/037853, dated Dec. 25, 2018.

* cited by examiner

LAMINATED SUBSTRATE

CROSS REFERENCE TO RELATED APPLICATIONS

The present application is a continuation of International application No. PCT/JP2018/037853, filed Oct. 11, 2018, which claims priority to Japanese Patent Application No. 2018-036577, filed Mar. 1, 2018, the entire contents of each of which are incorporated herein by reference.

FIELD OF THE INVENTION

The present invention relates to a laminated substrate.

BACKGROUND OF THE INVENTION

As a measure against heat dissipation of a wiring board, Patent Document 1 discloses a printed wiring board including a base plate layer and a conductor layer, in which a ceramic layer having a water-soluble binder is directly applied to a surface of the wiring board, so that the wiring board has both a characteristic as a solder resist and a ceramic layer having heat dissipation properties.

Patent Document 1 describes, as a first embodiment, a wiring board in which a base plate layer, a conductor layer, and a ceramic layer are laminated in this order. The ceramic layer is adhered to a surface of the conductor layer and also to the base plate layer. Therefore, heat generated on the base plate layer and the conductor layer is dissipated to the outside by the ceramic layer.

Further, in a second embodiment, the base plate layer, the conductor layer, and the ceramic layer are laminated in this order, and a heat-generating electric component such as a power transistor is attached to an opposite surface of the base plate layer with another conductor layer interposed therebetween. An opening is formed in the base plate layer, and a part of the opening is filled with heat conductive ceramic and is in contact with the conductor layers on both surfaces. Therefore, heat generated by the heat-generating electric component is dissipated to the outside through the ceramic layer and the conductor layer.

Patent Document 1: Japanese Patent Application Laid-Open No. 2002-329939

SUMMARY OF THE INVENTION

However, in Patent Document 1, an adhesive force between the ceramic layer having heat dissipation properties and the base plate layer or the conductive layer, or an adhesive force between thermally conductive ceramic and the base plate layer or the conductive layer is not sufficient. For this reason, cracks or peeling may occur due to a temperature cycle.

Further, although it is stated in Patent Document 1 that space can be significantly reduced, there is room for further improvement in reducing the size of the substrate.

The present invention has been made to solve the above problem, and an object of the present invention is to provide a laminated substrate that has high heat dissipation properties and can be reduced in size.

A laminated substrate of the present invention includes a substrate body having a plurality of laminated ceramic layers containing a first glass; a wiring conductor within the substrate body and comprising silver, copper, a silver alloy, or a copper alloy; and a thermal conductor within or on a main surface of the substrate body. The thermal conductor at least one of (1) a thermal via penetrating a part of a first ceramic layer of the plurality of ceramic layers in a thickness direction thereof, and (2) a heat spreader extending along a main surface of the first ceramic layer. A first thermal conductivity of the thermal conductor is higher than a second thermal conductivity of the first ceramic layer, and the thermal conductor contains an insulating ceramic as a main material thereof, and further contains a second glass.

In the laminated substrate of the present invention, the insulating ceramic is preferably a nitride ceramic.

In the laminated substrate of the present invention, a ratio of the second glass contained in the thermal conductor is preferably smaller than a ratio of the first glass contained in the first ceramic layer.

In this case, the ratio of the second glass contained in the thermal conductor is preferably 40 vol % or less.

In the laminated substrate of the present invention, the thermal conductor preferably contains an inorganic crystal material that is contained in the first ceramic layer in a region thereof adjacent to the first ceramic layer, and the first ceramic layer preferably contains the insulating ceramic that is contained in the thermal conductor in a region thereof adjacent to the thermal conductor.

In the laminated substrate of the present invention, the thermal conductor is preferably in contact with the wiring conductor.

In this case, the wiring conductor preferably contains the insulating ceramic that is contained in the thermal conductor in a region thereof in contact with the thermal conductor. Further, a first amount of a third glass in the wiring conductor in the region in contact with the thermal conductor is more than a second amount of the third glass in an internal region of the wiring conductor.

A width of a surface of the thermal conductor in contact with the wiring conductor is preferably larger than a width of the wiring conductor.

In the laminated substrate of the present invention, a difference between a first thermal expansion coefficient of the thermal conductor and a second thermal expansion coefficient of the first ceramic layer is preferably 3.2 ppm/° C. or less.

In the laminated substrate of the present invention, the thermal conductor is preferably the thermal via and has a first end portion thereof inside the substrate body.

The thermal via may have a second end portion at a main surface of the substrate body. Further, the thermal via may have the second end portion connected directly or indirectly to a first end portion of a second thermal conductor, and the second thermal conductor may have a second end portion thereof at a main surface of the substrate body.

In the laminated substrate of the present invention, the thermal conductor may also or alternatively preferably be the heat spreader and have a first end portion thereof inside the substrate body.

The heat spreader may have a second end portion thereof at a side surface of the substrate body.

According to the present invention, a laminated substrate which has high heat dissipation properties and can be reduced in size can be provided.

DETAILED DESCRIPTION OF THE INVENTION

Hereinafter, the laminated substrate of the present invention will be described.

However, the present invention is not limited to a configuration described below, and can be appropriately modified and applied without departing from the gist of the present invention. Note that the present invention also includes a combination of two or more of individual desirable configurations described below.

First, an overall configuration of a laminated substrate including at least one of a thermal via and a heat spreader as a thermal conductor will be described, and then a specific configuration of the thermal conductor will be described.

Each embodiment described below is an exemplification, and, as a matter of course, configurations shown in different embodiments can be partially replaced or combined.

Further, in a case where the embodiments are not particularly distinguished, the embodiments will be simply referred to as "the laminated substrate of the present invention".

[Laminated Substrate]

First Embodiment

The laminated substrate according to a first embodiment of the present invention includes a thermal via as a thermal conductor.

Figure 1:
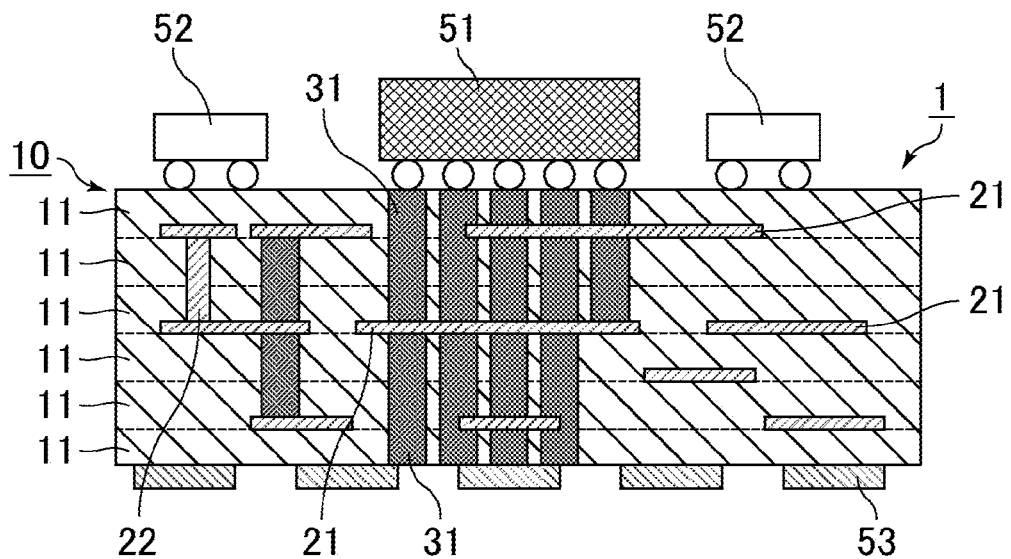
FIG. 1 is a cross-sectional view schematically showing one example of a laminated substrate according to a first embodiment of the present invention.

FIG. 1 is a cross-sectional view schematically showing one example of the laminated substrate according to the first embodiment of the present invention. FIG. 1 shows a state in which an electronic component is mounted on the laminated substrate of the present invention. The above similarly applies to FIG. 2 and subsequent drawings.

The laminated substrate 1 shown in FIG. 1 includes a substrate body 10, a conductor layer 21 and a conductor via 22 as wiring conductors, and a thermal via 31 as a thermal conductor.

The substrate body 10 is a laminate of a plurality of ceramic layers 11. The ceramic layer 11 is made from a ceramic material including glass. In FIG. 1, a boundary of the ceramic layer 11 adjacent to the ceramic layer 11 in a thickness direction (lamination direction) is shown by a broken line. However, in actuality, the boundary of the ceramic layer 11 cannot be visually recognized in some cases.

The material of the ceramic layer is preferably a low temperature sintered ceramic (LTCC) material. The LTCC material means a ceramic material that can be sintered at a firing temperature of 1000° C. or less and can be simultaneously fired with silver, copper, or the like. That is, the laminated substrate of the present invention can be considered as an LTCC substrate.

Examples of the LTCC material include a glass composite low temperature sintered ceramic material obtained by mixing borosilicate glass with a ceramic material such as alumina, quartz, and forsterite.

The ceramic layer may include an inorganic crystal material in addition to glass. For example, in a case where the ceramic layer is formed of the LTCC material, the ceramic layer may include, as an inorganic crystal material, a ceramic component such as alumina mixed with borosilicate glass or a crystal component precipitated from borosilicate glass.

The conductor layer 21 and the conductor via 22, which are wiring conductors, are provided inside the substrate body 10. The conductor layer 21 is disposed between the ceramic layers 11 and is provided so as to extend along a main surface of the ceramic layer 11. The conductor via 22 is provided so as to penetrate the ceramic layer 11 in a thickness direction. The conductor layer 21 and the conductor via 22 may also be used for thermal dissipation.

The wiring conductor is made from silver, copper, a silver alloy, or a copper alloy. The silver alloy is an alloy containing silver as a main component, and the copper alloy is an alloy containing copper as a main component. Note that the main component of the alloy means a component having a highest abundance ratio (% by weight), and preferably a component having an abundance ratio exceeding 50% by weight.

The thermal via 31, which is a thermal conductor, is provided inside the substrate body 10, and is provided so as to penetrate the ceramic layer 11 in the thickness direction. In FIG. 1, a first end portion of the thermal via 31 is positioned inside the substrate body 10 and is in contact with a main surface of the conductor layer 21. A second end portion of the thermal via 31 may be positioned at either one of the main surfaces of the substrate body 10 or may be in contact with the main surface of the conductor layer 21.

Thermal conductivity of the thermal via is higher than thermal conductivity of the ceramic layer 11 adjacent thereto in a direction along the main surface of the ceramic layer (a horizontal direction in FIG. 1). For this reason, the thermal via is excellent in heat dissipation properties and can release heat in the thickness direction of the ceramic layer.

Further, the thermal via contains an insulating ceramic as a main material thereof, and further contains a glass, and has insulating properties. Therefore, since the thermal via can be brought into contact with the wiring conductor, heat of the wiring conductor can be dissipated, and further, the wiring conductor can be used as a thermal conduction path.

Figure 2:
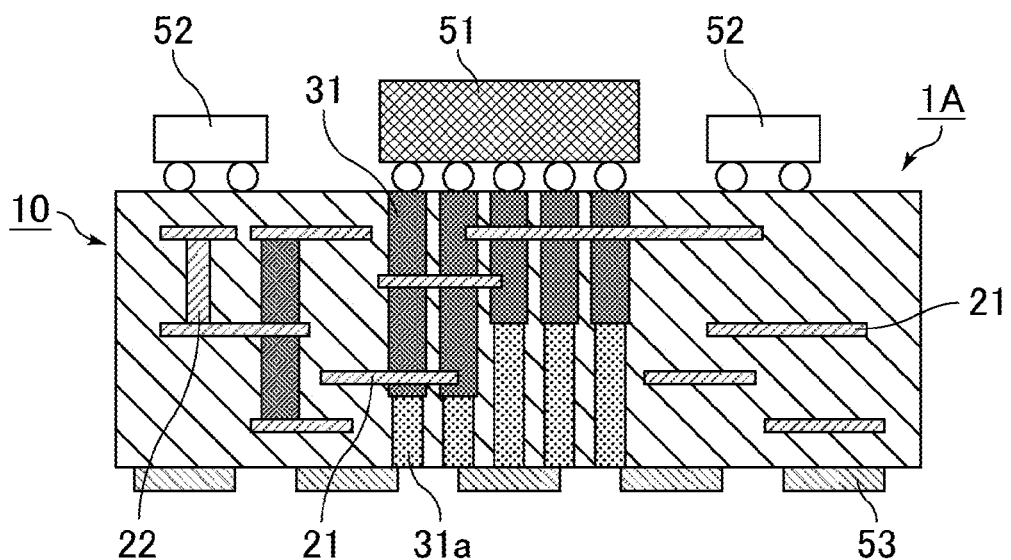
FIG. 2 is a cross-sectional view schematically showing another example of the laminated substrate according to the first embodiment of the present invention.

FIG. 2 is a cross-sectional view schematically showing another example of the laminated substrate according to the first embodiment of the present invention.

A laminated substrate 1A shown in FIG. 2 includes a metal thermal via 31a in addition to the thermal via 31. The metal thermal via 31a may also be used for electrical use.

As described above, the laminated substrate according to the first embodiment of the present invention may have a configuration in which the thermal via and the metal thermal via are combined.

The metal thermal via is preferably formed of the same metal as the conductor via that is a wiring conductor. That is, the metal thermal via is preferably formed of silver, copper, a silver alloy, or a copper alloy.

Figure 3:
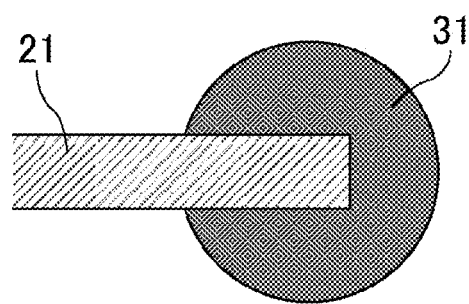
FIG. 3 is a plan view of a surface where a conductor layer and a thermal via are in contact with each other when viewed from a laminating direction.

FIG. 3 is a plan view of a surface where the conductor layer and the thermal via are in contact with each other when viewed from a laminating direction.

As shown in FIG. 3, the thermal via 31 preferably has a width larger than that of the conductor layer 21 on a surface in contact with the conductor layer 21. As described above, when the thermal via has a width larger than that of the conductor layer on the surface in contact with the conductor layer, a path for diffusing heat of the conductor layer can be widened, so that a heat radiation effect can be enhanced.

Second Embodiment

The laminated substrate according to a second embodiment of the present invention includes a heat spreader as a thermal conductor.

Figure 4:
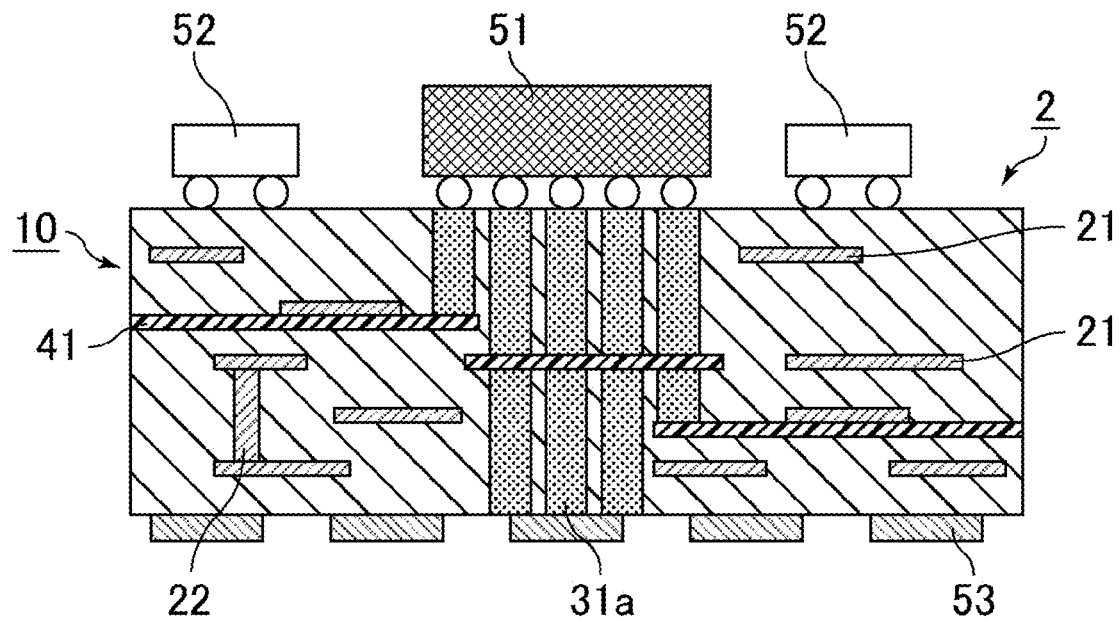
FIG. 4 is a cross-sectional view schematically showing one example of the laminated substrate according to a second embodiment of the present invention.

FIG. 4 is a cross-sectional view schematically showing one example of the laminated substrate according to the second embodiment of the present invention. A laminated substrate 2 shown in FIG. 4 includes the substrate body 10, the conductor layer 21 and the conductor via 22 as wiring conductors, and the metal thermal via 31a and a heat spreader 41 as thermal conductors.

The heat spreader 41, which is a thermal conductor, is provided inside the substrate body 10, and is provided so as to extend along the main surface of the ceramic layer 11. In FIG. 4, a first end portion of the heat spreader 41 is positioned inside the substrate body 10 and is in contact with a main surface of the conductor layer 21. The second end portion of the heat spreader 41 may be positioned at either one of the side surfaces of the substrate body 10 or may be in contact with the main surface of the conductor layer 21. Further, the heat spreader 41 may be provided at either one of main surfaces of the substrate body 10 (see FIG. 5, discussed below).

The heat spreader 41 preferably has a width larger than that of the conductor layer 21 on the surface in contact with the conductor layer 21.

Thermal conductivity of the heat spreader is higher than thermal conductivity of the adjacent ceramic layer in a thickness direction of the ceramic layer (a vertical direction in FIG. 4). For this reason, the heat spreader is excellent in heat dissipation properties and can release heat in a direction along the main surface of the ceramic layer.

Further, the heat spreader contains insulating ceramic as a main material thereof, and further contains glass, and has insulating properties. Therefore, since the heat spreader can be brought into contact with the wiring conductor, the heat of the wiring conductor can be dissipated, and the wiring conductor can be used as a heat conduction path.

Third Embodiment

The laminated substrate according to a third embodiment of the present invention includes both the thermal via and the heat spreader as thermal conductors.

Figure 5:
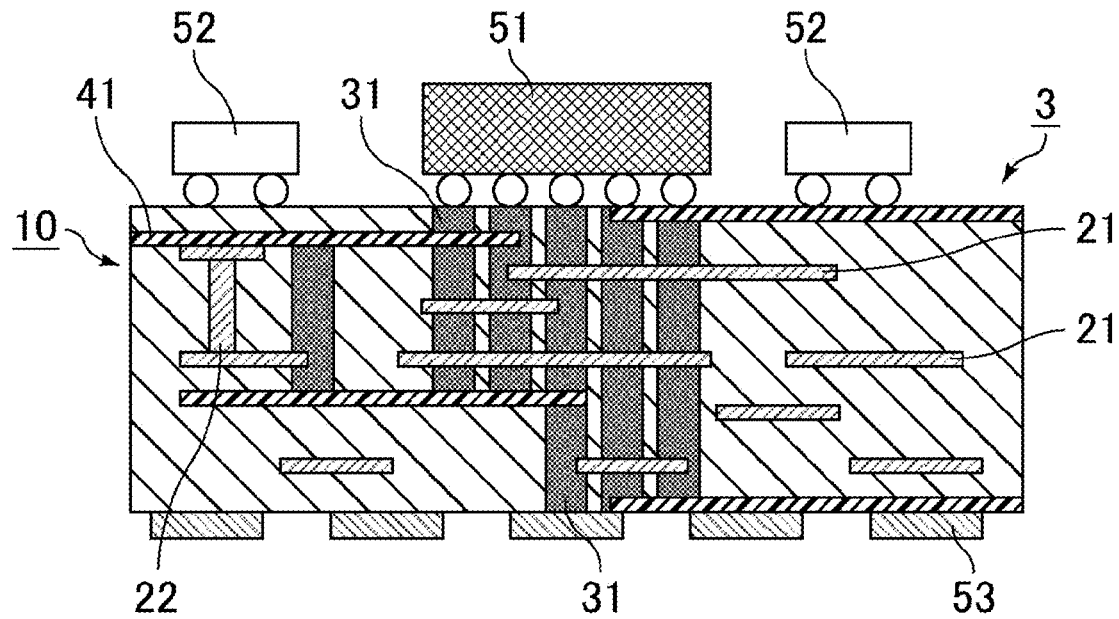
FIG. 5 is a cross-sectional view schematically showing one example of the laminated substrate according to a third embodiment of the present invention.

FIG. 5 is a cross-sectional view schematically showing one example of the laminated substrate according to the third embodiment of the present invention.

A laminated substrate 3 shown in FIG. 5 includes the substrate body 10, the conductor layer 21 and the conductor via 22 as wiring conductors, and the thermal via 31 and the heat spreader 41 as thermal conductors.

Figure 6:
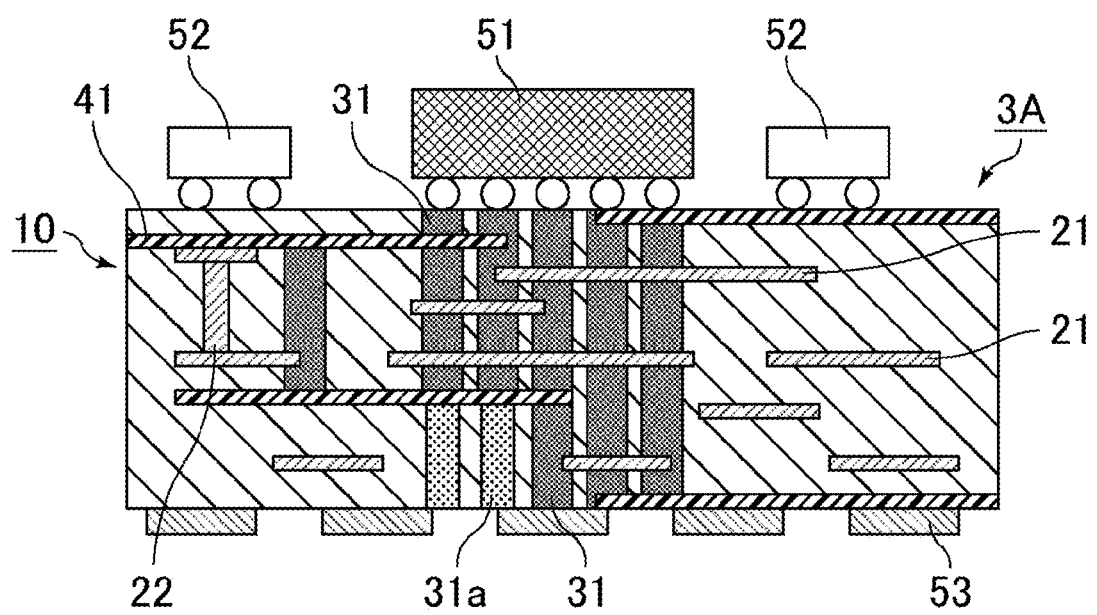
FIG. 6 is a cross-sectional view schematically showing another example of the laminated substrate according to the third embodiment of the present invention.

FIG. 6 is a cross-sectional view schematically showing another example of the laminated substrate according to the third embodiment of the present invention.

A laminated substrate 3A shown in FIG. 6 includes the metal thermal via 31a in addition to the thermal via 31.

In the laminated substrate 1 shown in FIG. 1, the laminated substrate 1A shown in FIG. 2, the laminated substrate 2 shown in FIG. 4, the laminated substrate 3 shown in FIG. 5, and the laminated substrate 3A shown in FIG. 6, an active component 51 and a passive component 52 as electronic components are mounted on one main surface of the substrate body 10. On one main surface of the substrate body 10, both the active component 51 and the passive component 52 may be mounted, or one of the active component 51 and the passive component 52 may be mounted. Further, on one main surface of the substrate body 10, a composite of the active component 51 and the passive component 52 may be mounted.

Examples of the active component include a semiconductor element such as a transistor, a diode, an IC, or an LSI. Examples of the passive component include a chip component such as a resistor, a capacitor, or an inductor, a vibrator, a filter, or the like.

On the other main surface of the substrate body 10, a metal terminal 53 is provided. The metal terminal 53 is used as an electrical connecting means when the laminated substrate 1 or the like, on which an electronic component is mounted, is mounted on a motherboard (not shown).

[Thermal Conductor]

As described above, the laminated substrate of the present invention includes at least one of the thermal via and the heat spreader as a thermal conductor. The laminated substrate of the present invention may further include the metal thermal via.

In the laminated substrate of the present invention, the thermal conductivity of the thermal conductor is higher than the thermal conductivity of the adjacent ceramic layer. For this reason, by providing the thermal conductor inside the laminated substrate, on which heat-generating electronic components such as the active component and the passive component are mounted, heat generated from the electronic components can be dissipated.

Specifically, by taking out the thermal conductor and the ceramic layer from the laminated substrate and comparing the thermal conductivity of the thermal conductor with the thermal conductivity of the ceramic layer using thermography, the thermal conductivity of the thermal conductor can be confirmed to be higher than the thermal conductivity of the adjacent ceramic layer.

The thermal conductor included in the laminated substrate of the present invention contains an insulating ceramic as a main material thereof, and further contains a glass.

In the present description, the main material of the thermal conductor means a material having a highest abundance ratio (% by volume), and preferably a material having an abundance ratio exceeding 50% by volume.

The insulating ceramic contained as a main material in the thermal conductor preferably has a volume resistivity (JIS C 2141) of $10^{12}$ Ω·cm or more from the viewpoint of ensuring insulation.

The thermal conductor, which has insulating properties, can be provided inside the substrate body in a state of being in contact with the wiring conductor. For this reason, not only can the wiring density be increased, but also the wiring conductor can be used as a heat dissipation path.

Further, the fact that the wiring density can be increased means that size can be reduced when the present invention is applied to a module substrate having the same specifications. With an increase in the number of components due to higher functionality, there is a remarkable shortage of component mounting space in electronic devices such as a smartphone, and reduction in size of a module substrate has become an urgent issue. Therefore, the laminated substrate of the present invention is advantageous for reduction in size.

Examples of the insulating ceramic include nitride ceramic, oxide ceramic, and the like. The insulating ceramic may be of only one kind or a mixture of two or more kinds. Examples of the nitride ceramic include aluminum nitride (AlN), boron nitride (BN), silicon nitride ($Si_3N_4$), and the like. Examples of the oxide ceramic include alumina ($hAl_2O_3$) and the like.

From the viewpoint of ensuring insulating properties and thermal conductivity, and firmly bonding to the ceramic layer, the insulating ceramic is preferably nitride ceramic.

Examples of the glass contained in the thermal conductor include glass containing $SiO_2$ and $B_2O_3$ as essential components, and the like. The glass may contain, as an optional component, at least one kind selected from a group consisting of MgO, $Al_2O_3$, SrO, CaO, BaO, and ZnO, and at least one kind selected from a group consisting of $Li_2O$, $Na_2O$, and $K_2O$.

When a laminate of ceramic green sheets is fired to obtain the substrate body, a small amount of the glass contained in the thermal conductor diffuses into the wiring conductor, so that the thermal conductor and the wiring conductor can be firmly bonded. As a result, cracks or peeling due to a difference in thermal expansion coefficient between the wiring conductor and the thermal conductor is less likely to occur.

Further, a small amount of the insulating ceramic or the glass in the thermal conductor diffuses into the ceramic layer, and conversely, a small amount of the glass or an inorganic crystal material in the ceramic layer diffuses into the thermal conductor, so that the thermal conductor and the ceramic layer can be firmly bonded. As a result, cracks or peeling due to a temperature cycle is less likely to occur.

Furthermore, by adjusting a glass ratio in the ceramic layer and a glass ratio in the thermal conductor, thermal expansion coefficients of both of them can be controlled, and particularly in an environment exposed to a temperature cycle having a large temperature difference, a difference in the thermal expansion coefficients can be reduced so that cracks or peeling does not occur.

The ratio of the glass contained in the thermal conductor is not particularly limited, but is preferably smaller than the ratio of the glass contained in the ceramic layer adjacent to the thermal conductor from the viewpoint of ensuring the thermal conductivity. In this case, the ratio of the glass contained in the thermal conductor is preferably 40 vol % or less. On the other hand, from the viewpoint of bonding the wiring conductor and the thermal conductor, the ratio of the glass contained in the thermal conductor is preferably 5 vol % or more.

The ratio of the glass contained in the thermal conductor can be measured by cross-sectional observation using a scanning electron microscope (SEM) and elemental analysis using energy dispersive X-ray spectroscopy (EDS).

In the laminated substrate of the present invention, the difference between the thermal expansion coefficient of the thermal conductor and the thermal expansion coefficient of the ceramic layer adjacent to the thermal conductor is preferably 3.2 ppm/° C. or less. Further, the difference between the thermal expansion coefficient of the thermal conductor and the thermal expansion coefficient of the ceramic layer adjacent to the thermal conductor is preferably 1 ppm/° C. or more.

The thermal expansion coefficient of the thermal conductor or the ceramic layer can be measured by a thermomechanical analyzer (TMA).

In the laminated substrate of the present invention, the thermal conductor and the ceramic layer diffuse to each other, so that the bond between them is strengthened. Therefore, the thermal conductor preferably contains an inorganic crystal material contained in the ceramic layer in a region adjacent to the ceramic layer, and the ceramic layer preferably contains insulating ceramic contained in the thermal conductor in a region adjacent to the thermal conductor. In this manner, even when heat of the electronic component that is under a high-temperature environment or at a high temperature is dissipated by the thermal conductor, and the heat is transmitted to the substrate, deformation of or damage to the substrate can be suppressed.

Specifically, by cutting out a cross section of the thermal conductor or the ceramic layer and performing EDS, inclusion of an inorganic crystal material such as alumina in the thermal conductor, and inclusion of insulating ceramic such as a nitride ceramic in the ceramic layer can be confirmed from element mapping. Further, inclusion of a crystal component in the thermal conductor or the ceramic layer can be confirmed by X-ray diffraction (XRD) analysis.

In the laminated substrate of the present invention, the thermal conductor is preferably in contact with a main surface of the wiring conductor. Specifically, the thermal conductor is preferably in contact with a main surface of the conductor layer or the conductor via. The thermal conductor, which has insulating properties, can be brought into contact with the wiring conductor. Therefore, heat of the wiring conductor can be dissipated, and further, the wiring conductor can be used as a thermal conduction path.

In this case, the wiring conductor preferably contains insulating ceramic contained in the thermal conductor in a region in contact with the thermal conductor. Further, the wiring conductor preferably contains more glass in the region in contact with the thermal conductor than in an internal region. When the material constituting the thermal conductor diffuses to the wiring conductor, the bond between the thermal conductor and the wiring conductor is strengthened. Further, the wiring conductor and the thermal conductor, which have different thermal conductivity, may be damaged at an interface under a high temperature environment due to the difference in thermal conductivity between them. However, such damage can be suppressed as the material constituting the thermal conductor diffuses to the wiring conductor.

Further, the thermal conductor preferably has a width larger than that of the wiring conductor on a surface in contact with the wiring conductor. In this case, a wide path for diffusing the heat of the wiring conductor can be taken, so that a heat radiation effect can be enhanced.

In the laminated substrate of the present invention, in a case where the thermal conductor is the thermal via, the first end portion is preferably positioned inside the substrate body. When the first end portion of the thermal via is positioned inside the substrate body, heat inside the laminated substrate can be enlarged as much as a surface area of the thermal conductor and diffused.

The thermal via having the first end portion positioned inside the substrate body may have the second end portion positioned on the main surface of the substrate body. Further, the thermal via having the first end portion positioned inside the substrate body may have the second end portion connected directly or indirectly to the first end portion of a different thermal conductor, and the different thermal conductor may have the second end portion positioned on the main surface of the substrate body. In this manner, heat inside the laminated substrate can be dissipated to the outside on the main surface side.

A different thermal conductor may be a thermal via containing insulating ceramic as a main material, or may be a metal thermal via. Further, in a case where a thermal via is indirectly connected to a different thermal conductor, a thermal via containing insulating ceramic as a main material, a wiring conductor, a metal thermal via, and the like exist between the thermal via and the different thermal conductor. A heat spreader containing insulating ceramic as a main material may exist between the thermal via and the different thermal conductor.

In the laminated substrate of the present invention, in a case where the thermal conductor is the heat spreader, the first end portion is preferably positioned inside the substrate body. When the first end portion of the heat spreader is positioned inside the substrate body, heat inside the laminated substrate can be enlarged as much as a surface area of the thermal conductor and diffused.

The heat spreader having the first end portion positioned inside the substrate body may have the second end portion positioned on a side surface of the substrate body. In this manner, heat inside the laminated substrate can be dissipated to the outside on the side surface side.

The laminated substrate of the present invention is preferably manufactured as described below.

First, glass powder, ceramic powder, a dispersant, an organic binder, and an organic solvent are mixed to obtain a slurry, and the slurry is cast on a carrier film to produce a ceramic green sheet to be the ceramic layer. A specific ceramic green sheet is irradiated with a $CO_2$ laser to form a via hole.

Next, the via hole formed on the ceramic green sheet is filled with via paste. Silver paste or copper paste can be used as wiring conductor paste. In a case where a thermal via containing insulating ceramic as a main material is formed, insulating ceramic paste containing glass powder and nitride ceramic powder can be used, and in a case where a metal thermal via is formed, wiring conductor paste can be used.

These pastes can be produced by kneading a predetermined amount of metal powder or glass powder, nitride ceramic powder, a dispersant, an organic binder, and an organic solvent with a mixer, and then dispersing them with a three-roll mill.

A conductor layer is formed on a surface of the ceramic green sheet using silver paste or copper paste by a screen printing method. Further, in a case where the heat spreader is formed, the heat spreader can be formed by applying the insulating ceramic paste on a surface of the ceramic green sheet by a screen printing method.

A laminate is produced by thermocompression bonding a predetermined number of ceramic green sheets having a conductor layer, a conductor via, a metal thermal via, a thermal conductor, and the like. The obtained laminate of ceramic green sheets is disposed on a firing jig such as a setter, and then fired in a predetermined gas atmosphere. From the above, the laminated substrate of the present invention is obtained.

The laminated substrate of the present invention is not limited to the above embodiment, and various applications and modifications can be made within the scope of the present invention with respect to, for example, the configuration, manufacturing conditions, and the like of the laminated substrate.

For example, in a case where the laminated substrate of the present invention includes a metal thermal via, the thermal via positioned on a main surface of the substrate body may be a thermal via containing insulating ceramic as a main material, or may be a metal thermal via.

Further, in a case where an end portion of the heat spreader is positioned on a side surface of the substrate body, a metal seal provided on the side surface of the substrate body and the heat spreader may be connected. In this case, heat inside the laminated substrate can be further released.

DESCRIPTION OF REFERENCE SYMBOLS 1, 1A, 2, 3, 3A: Laminated substrate
10: Substrate body
11: Ceramic layer
21: Conductor layer
22: Conductor via
31: Thermal via
31a: Metal thermal via
41: Heat spreader
51: Active component
52: Passive component
53: Metal terminal

The invention claimed is:
1. A laminated substrate comprising:
a substrate body having a plurality of laminated ceramic layers, each of the plurality of laminated ceramic layers containing a first glass;
a wiring conductor within the substrate body, the wiring conductor comprising silver, copper, a silver alloy, or a copper alloy; and
a thermal conductor within or on a main surface of the substrate body,
wherein the thermal conductor is at least one of (1) a thermal via penetrating a part of a first ceramic layer of the plurality of laminated ceramic layers in a thickness direction thereof, and (2) a heat spreader extending along a main surface of the first ceramic layer of the plurality of ceramic layers,
a first thermal conductivity of the thermal conductor is higher than a second thermal conductivity of the first ceramic layer,
the thermal conductor contains an insulating ceramic as a main material thereof, and further contains a second glass,
a first laminated ceramic layer of the plurality of laminated ceramic layers of the substrate body that is in contact with the thermal conductor contains both the first glass and the second glass, and
the thermal conductor in contact with the first laminated ceramic layer contains both the first glass and the second glass.
2. The laminated substrate according to claim 1, wherein the insulating ceramic is a nitride ceramic.
3. The laminated substrate according to claim 1, wherein a ratio of the second glass contained in the thermal conductor is smaller than a ratio of the first glass contained in the first ceramic layer.
4. The laminated substrate according to claim 3, wherein the ratio of the second glass contained in the thermal conductor is 40 vol % or less.

5. The laminated substrate according to claim 1, wherein
the thermal conductor contains an inorganic crystal material that is in the first ceramic layer in a region thereof adjacent to the first ceramic layer, and
the first ceramic layer contains the insulating ceramic that is in the thermal conductor in a region thereof adjacent to the thermal conductor.

6. The laminated substrate according to claim 1, wherein the thermal conductor is in contact with the wiring conductor.

7. The laminated substrate according to claim 6, wherein the wiring conductor contains the insulating ceramic that is in the thermal conductor in a region thereof that is in contact with the thermal conductor.

8. The laminated substrate according to claim 7, wherein a first amount of a third glass in the wiring conductor in the region in contact with the thermal conductor is more than a second amount of the third glass in an internal region of the wiring conductor.

9. The laminated substrate according to claim 6, wherein a width of a surface of the thermal conductor in contact with the wiring conductor is larger than a width of the wiring conductor.

10. The laminated substrate according to claim 1, wherein a difference between a first thermal expansion coefficient of the thermal conductor and a second thermal expansion coefficient of the first ceramic layer is 3.2 ppm/° C. or less.

11. The laminated substrate according to claim 1, wherein the thermal conductor is the thermal via and has a first end portion thereof inside the substrate body.

12. The laminated substrate according to claim 11, wherein the thermal via has a second end portion at a main surface of the substrate body.

13. The laminated substrate according to claim 11, wherein
the thermal via has a second end portion thereof directly or indirectly connected to a first end portion of a second thermal conductor, and
the second thermal conductor has a second end portion at a main surface of the substrate body.

14. The laminated substrate according to claim 1, wherein the thermal conductor is the heat spreader and has a first end portion thereof inside the substrate body.

15. The laminated substrate according to claim 14, wherein the heat spreader has a second end portion at a side surface of the substrate body.

16. The laminated substrate according to claim 1, wherein
the thermal conductor is a first thermal conductor,
the first thermal conductor is the thermal via,
the laminated substrate further comprises a second thermal conductor, and
the second thermal conductor is a heat spreader that extends along the main surface of the first ceramic layer or extends along a main surface of a second ceramic layer of the plurality of ceramic layers.

17. The laminated substrate according to claim 16, wherein the thermal via has a first end portion thereof inside the substrate body.

18. The laminated substrate according to claim 17, wherein the thermal via has a second end portion at a main surface of the substrate body.

19. The laminated substrate according to claim 16, wherein the heat spreader has a first end portion thereof inside the substrate body.

20. The laminated substrate according to claim 19, wherein the heat spreader has a second end portion at a side surface of the substrate body.

* * * * *